(12) United States Patent
Boswell et al.

(10) Patent No.: US 10,128,076 B1
(45) Date of Patent: Nov. 13, 2018

(54) INDUCTIVELY COUPLED PLASMA ION SOURCE WITH TUNABLE RADIO FREQUENCY POWER

(71) Applicant: Oregon Physics, LLC, Hillsboro, OR (US)

(72) Inventors: Roderick W. Boswell, Canberra (AU); Noel S. Smith, Lake Oswego, OR (US); Paul P. Tesch, Portland, OR (US); Noel P. Martin, Hillsboro, OR (US); Philip J. Witham, Portland, OR (US)

(73) Assignee: OREGON PHYSICS, LLC, Beaverton, OR (US)

( * ) Notice: Subject to any disclaimer, the term of this patent is extended or adjusted under 35 U.S.C. 154(b) by 15 days.

(21) Appl. No.: 15/595,608

(22) Filed: May 15, 2017

(51) Int. Cl.
| | |
|---|---|
| *H05H 1/24* | (2006.01) |
| *H05H 1/46* | (2006.01) |
| *H01J 27/00* | (2006.01) |
| *H01J 27/16* | (2006.01) |
| *H01J 27/02* | (2006.01) |

(52) U.S. Cl.
CPC ............ *H01J 27/16* (2013.01); *H01J 27/022* (2013.01); *H01J 27/028* (2013.01)

(58) Field of Classification Search
CPC .......... H05H 1/24; H01J 27/16; H01J 27/022; H01J 27/028; H01J 27/02; H01J 27/08
USPC ................ 250/423 R, 424, 426; 315/111.21, 315/111.71, 111.81
See application file for complete search history.

(56) References Cited

U.S. PATENT DOCUMENTS

| | | | |
|---|---|---|---|
| 2014/0077699 A1* | 3/2014 | Boswell | ................... H01J 27/16 315/111.31 |
| 2016/0360602 A1* | 12/2016 | Cheung | .................... H05H 1/30 |

* cited by examiner

*Primary Examiner* — Nicole Ippolito
(74) *Attorney, Agent, or Firm* — Schaffer IP Law, LLC

(57) ABSTRACT

In a plasma ion source having an induction coil adjacent to a reactor chamber for inductively coupling power into the plasma from a radio frequency power source and designed for negative and positive ion extraction, a method for operating the source according to the invention comprises providing radio frequency power to the induction coil with a RF amplifier operating with a variable frequency connected to a matching network mainly comprised of fixed value capacitors. In this device, the impedance between the RF power source and the plasma ion source is matched by tuning the RF frequency rather than adjusting the capacitance of the matching network. An option to use a RF power source utilizing lateral diffused metal oxide semiconductor field effect transistor based amplifiers is disclosed.

12 Claims, 5 Drawing Sheets

INDUCTIVELY COUPLED PLASMA ION SOURCE WITH TUNABLE RADIO FREQUENCY POWER

CROSS-REFERENCES TO RELATED APPLICATIONS

This application is a continuation-in-part and claims the benefit of U.S. patent application Ser. No. 14/028,305, filed Sep. 16, 2013, which itself claims the benefit of Provisional Patent Application No. 61/701,495, filed Sep. 14, 2012, all of whose contents are incorporated herein for all purposes.

BACKGROUND OF THE INVENTION

1. Field of the Invention

This invention relates generally to plasma ion sources and more particularly to methods for providing RF power, magnetic filtering, and high voltage isolation to an inductively coupled plasma ion source 2. Description of the Prior Art Focused ion beam (FIB) tools are used for nanometer scale precision material removal. The benefits of FIB tools include nano-scale beam placement accuracy, a combined imaging and patterning system for accurate sample registration and pattern placement, and low structural damage of the area surrounding the removed volume. However, conventional FIB systems typically have a maximum removal rate of ~5 $\mu m^3/s$ that limits their usefulness for removing volumes with dimensions exceeding 10 $\mu m$. Conventional FIB systems are further limited by the low angular intensity of the ion source, so at large beam currents the beam size dramatically increases from spherical aberration. For high beam currents and hence high removal rates of material, a high angular intensity is required, along with high brightness and low energy spread.

Focused ion beams are often referred to as 'primary' ion beams when used on secondary ion mass spectrometer (SIMS) systems. Here the term 'primary' is used to differentiate it from the secondary ion beam. As with FIB tools, SIMS tools use the focused primary ion beam for precise, sputter removal of atoms and molecules from a material surface. SIMS tools are primarily used to determine the spatial distribution of chemical constituents in the near surface region of a material. Oxygen primary ion beams are beneficial to enhance the yield of positively charged secondary ions from the sample material, and hence enhance the sensitivity of the SIMS measurement. Negatively charged oxygen ion beams, not only enhance the yield of positively charged secondary ions, but also result in minimal sample charge buildup when the sample is a dielectric material. The state-of-the-art SIMS instruments employ duoplasmatron ion sources to produce negative oxygen primary ion beams. Duoplasmatrons have insufficient brightness (~40 $Am^{-2}sr^{-1}V^{-1}$) and lifetime to produce the spatial resolution required for many SIMS applications. Duoplasmatrons also produce ion beams with a relatively large axial energy spread (~15 eV), which is also problematic when endeavoring to produce high spatial resolution focused primary ion beams.

One solution is to use an inductively coupled plasma ion source. Inductively coupled plasma ion sources typically wrap an RF antenna about a plasma chamber. Energy is transferred by inductively coupling power from the antenna into the plasma. A RF power supply with 50 Ohm output impedance utilizes an impedance matching network so that the output of the RF supply can be efficiently coupled to the plasma which has an impedance substantially lower than 50 ohms. To extract negative ions from the ion source, it is typically necessary to use a transverse magnetic field near the source aperture to modify the plasma to allow negative ions to leave the plasma and to separate unwanted electrons that are extracted with the negative ion beam.

Other applications for this type of plasma source include its use as the primary ion source for Ion Scattering Spectroscopy (ISS), focused and projection ion beam lithography, proton therapy, and high energy particle accelerators.

In all cases, a high power density is deposited into the plasma from the antenna in order to create a high density plasma, and the plasma is biased to a potential of a hundred Volts or higher with respect to ground. An ion beam is extracted from a small aperture and is accelerated through a bias voltage to produce a fine beam of energetic ions.

One issue in the design of plasma ion sources is how to create an optimum magnetic field near the extraction aperture while a high voltage bias is applied to the plasma chamber. A second issue is how to provide radio frequency power to the antenna when the effective impedance of the plasma is very low compared to common RF power supply output impedances. This is especially problematic because the effective impedance of the plasma varies with plasma chamber gas pressure, gas composition, and the change of state during plasma ignition. A third problem is how to introduce gas into a reactor chamber that is biased to a high voltage without having high voltage breakdown through the input gas line.

Accordingly, the need arises for new designs and methods that provide efficient RF power to plasma ion sources, as well as improve the magnetic filtering and high voltage stability of plasma ion sources.

SUMMARY OF THE INVENTION

The present invention provides a solution for providing RF power to inductively coupled ion sources as well as improved magnetic filtering and high voltage isolation to plasma ion sources biased to high voltage.

In a plasma ion source having an induction coil adjacent to a reactor chamber for inductively coupling power into the plasma from a radio frequency power source, a method for operating the source according to the invention comprises providing radio frequency power to the induction coil with a RF amplifier operating with a variable frequency connected to a matching network mainly comprised of fixed value capacitors. In this device the impedance between the RF power source and the plasma ion source is matched by tuning the RF frequency rather than adjusting the capacitance of the matching network. An option to use a RF power source utilizing lateral diffused metal oxide semiconductor field effect transistor based amplifiers is disclosed.

A magnetic circuit design for coupling magnetic flux into a plasma reactor chamber that is biased to a high voltage is also disclosed. The magnetic circuit comprises a source of magnetic flux located at ground potential combined with a high permeability magnetic circuit that channels magnetic flux through a high voltage gap to provide magnetic flux into a plasma reactor chamber and an exit aperture that is biased to high voltage. This design has a portion of a magnetic circuit in contact with a plasma reactor chamber that is biased to high voltage, where the circuit can transfer magnetic flux from a second ground based portioned of a magnetic circuit while electrically isolating the two portions of the magnetic circuit.

A gas feed insulator design that improves the high voltage standoff by reducing the electric field along the insulator path is further disclosed. This design results in a short path within the insulator in the direction of the electric field to minimize avalanche breakdown within the insulator.

Finally, the patent describes an ion source that allows for negative ion extraction (or positive ions). The negative ion extraction is facilitated by the transverse magnetic field, that's created by the magnetic circuit. Optimal negative ion generation is achieved with an RF frequency that's greater than 40 MHz. Impedance matching at 40 MHz or above, is made significantly easier by using fixed capacitors and a variable RF frequency to achieve the matching. Variable frequency impedance tuning also allows the impedance match circuit to be more compact, lower complexity and power efficient. Variable frequency tuning eliminates the need for mechanically adjustable capacitors that require servo or stepper motors to drive them, thus minimizing the complexity of the impedance matching device.

The foregoing and other objects, features and advantages of the invention will become more readily apparent from the following detailed description of a preferred embodiment of the invention that proceeds with reference to the accompanying drawings.

DETAILED DESCRIPTION OF THE INVENTION

Figure 1:
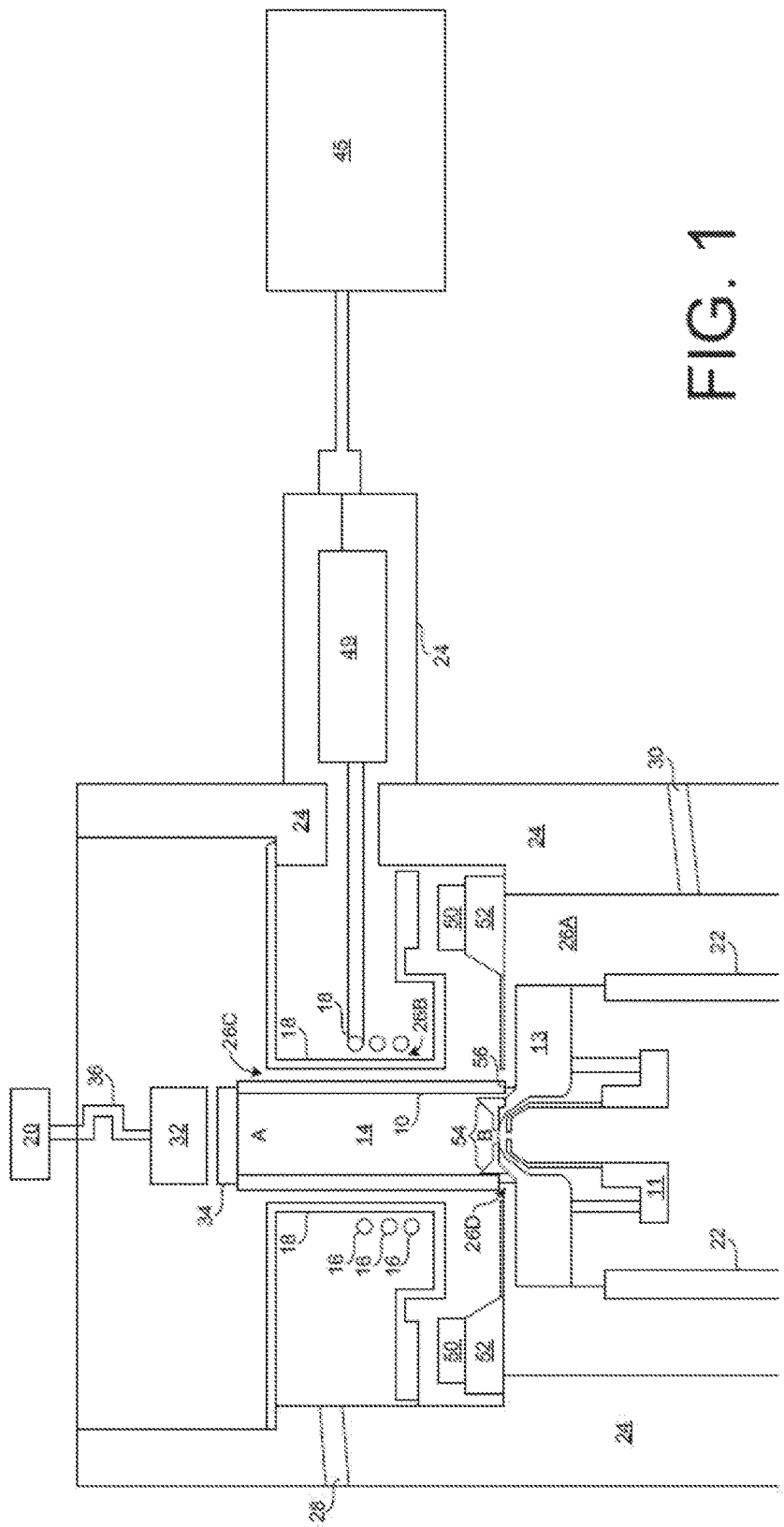
FIG. 1 is a schematic view showing a side elevation of a plasma ion source implemented according to teachings of the present invention.

FIG. 1 shows an inductively coupled plasma source that includes a ceramic tube 10, enclosing the plasma chamber 14, welded between a first upstream metal flange 34 and a second downstream vacuum flange 13. Windings of an RF antenna 16 are wrapped around, but electrically isolated (e.g. slightly spaced) from, the cylindrical outer walls of ceramic tube 10. As will be further appreciated through the description below, RF antenna 16 is further electrically isolated from the cylindrical outer walls of the ceramic tube 10 by filling of the space between them with a dielectric fluid. A split Faraday shield 18 surrounds the cylindrical outer walls of ceramic tube 10 and is interposed between the RF antenna 16 and the ceramic tube 10. Shield 18 includes a plurality of slits through the wall of the shield 18 facing the ceramic tube 10, with a space between the shield 18 and tube 10 being filled with the dielectric fluid.

A gas inlet 20 communicates with an upstream opening A in the plasma chamber 14 to supply material that is later formed into a plasma. Plasma chamber 14 is referenced to high voltage while the surrounding RF shielding—e.g. implemented as Faraday shield 18—and RF antenna 16 making plural windings about the ceramic tube 10, are referenced to ground. A source of radio frequency power 45, and an impedance matching network comprised of multiple capacitors 49 are electrically connected to the RF antenna 16. The impedance matching network 49 uses fixed value high voltage capacitors in a radio frequency circuit and in some instances trimmer capacitors may be used to make small adjustment to the capacitance of portions of this circuit.

The source of radio frequency power 45 can operate over a range of frequencies in the High Frequency and Very High Frequency bands. Preferably, radio frequency power should operate above about 40 Mhz when powering a plasma source that contains a magnetic circuit, as this has been found to provide efficiency advantages.

A source electrode of the plasma chamber has an exit aperture B, opposite the side adjacent the gas inlet 20, and is in further communication with an extraction electrode 11 and focusing optics located downstream (not shown). Ions extracted from the plasma are then focused into a beam and directed downstream within a ceramic vacuum break 22. A magnetic circuit consisting of an electromagnetic or permanent magnet source of a magnetic flux 50, outer magnetic poles 52 based at ground potential, and inner magnetic poles 54 biased at the reactor chamber voltage operate to produce a magnetic field near the exit aperture B. This magnetic field can be set to a relatively high strength to modify the plasma potential to allow for negative ion extraction and separate electrons from the extracted ion beam, or set to a relatively low strength to just limit electron loss to the source electrode and enhance positive ion extraction without significantly modifying the plasma potential. The plasma tube 10 is attached to the vacuum flange 13 through a non-magnetic tube 56 brazed to the plasma tube 10.

Figure 2:
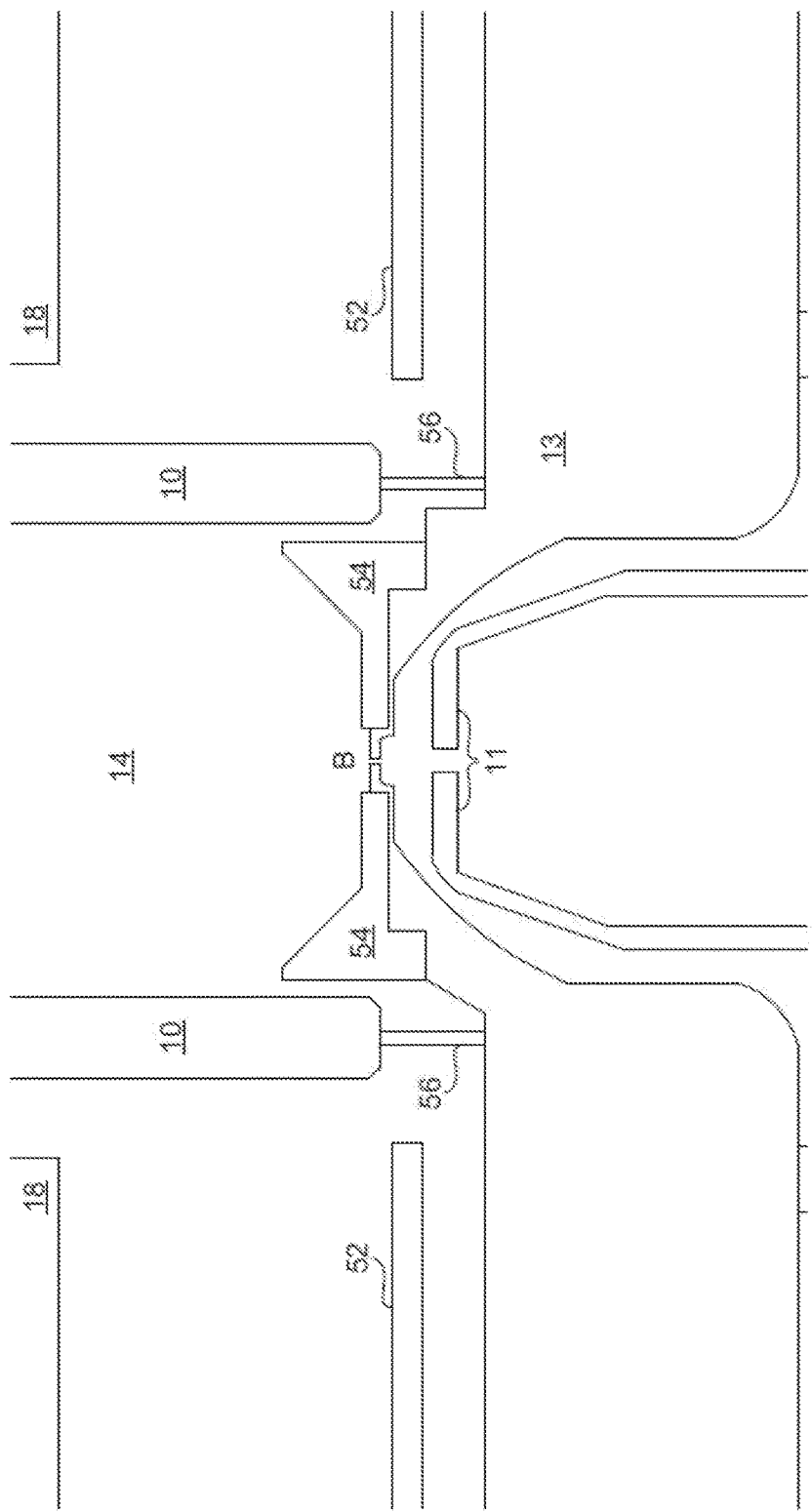
FIG. 2 is a schematic view showing a side elevation of a preferred magnetic circuit design used in the plasma ion source of FIG. 1.

FIG. 2 shows a detailed view of the magnetic circuit. All elements are retained within a can 24 that surrounds the whole assembly and is held at ground potential. The assembly in this way forms spaces (e.g. spaces 26a, 26b, 26c, and 26d) between the can 24 and the outer surface of the plasma chamber 14 and ceramic vacuum break 22 (space 26a), between the antenna 16 and the Faraday shield 18 (space 26b), between the ceramic plasma tube 10 and the Faraday shield 18 (space 26c), and particularly between the outer magnetic poles 54 and the plasma tube 10 (space 26d). All spaces are in fluid communication with one another, and form a fluid circuit, so that a fluid introduced through inlet 28 can be pumped through all spaces and exit outlet 30.

Operation of the RF plasma source results in significant power being deposited into the plasma and the antenna, which would create thermal issues and failure within the device if efficient heat dissipation were not implemented. Air cooling may be used, but such is typically inefficient within a small space such as that defined by the plasma ion source. Water cooling is also a possibility for cooling, but it has poor dielectric properties and its reactivity with other materials can create problems. Furthermore, maintaining different parts of the assembly at different voltages also creates operational issues absent adequate insulation between the parts.

The invention uses a dielectric fluid as a coolant. The dielectric fluid has been found to exhibit efficient coolant properties when used in the environment of the plasma ion source. Furthermore, a dielectric fluid provides high voltage isolation between the plasma chamber (at high voltage) and the other parts at ground potential including the outer magnetic poles. The dielectric fluid also can provide high voltage isolation between the antenna and the Faraday shield as well as between the impedance matching network capacitors and the surrounding ground planes. A cooling circuit is created within the device so that the dielectric fluid circulates between the plasma chamber 14 and the can 24 throughout the device, and preferably through spaces 26a, 26b, 26d, and 26c. Use of the dielectric coolant around the inductively coupled plasma ion source has been found to keep the plasma chamber and antenna operating at a stable temperature (near room temperature) and reduces the gaps required for high voltage stability. More specifically, use of the dielectric fluid both electrically insulates the plasma chamber, so that it can be biased to 30 kV and up, and efficiently transfers heat away from the plasma chamber. The advantages of this approach are:

1. The entire outer surface of the plasma chamber, the impedance matching network, the magnetic flux source, and the antenna can have their thermal energy efficiently transferred away from the ion source.
2. The split Faraday shield can be held at ground potential while maintaining a minimal gap between the shield and the plasma chamber. Consequently, the antenna can be in close proximity to the plasma chamber so that power coupling is more efficient.
3. The outer magnetic poles can be held at ground potential while maintaining a minimal gap between the outer magnetic pole and the plasma chamber. Consequently, the outer magnetic pole can be in close proximity to the plasma chamber and the inner magnetic poles so that magnetic flux is coupled efficiently between the inner and outer magnetic poles.
4. The antenna, and the matchbox and RF amplifier used to drive the antenna, are ground referenced (i.e. are not biased at the same potential as the plasma).
5. The dielectric fluid is chemically inert and has a very low power dissipation factor (loss tangent) at RF frequencies. This is unlike water that is susceptible to large variations in its loss tangent depending on its purity.

In a preferred embodiment, the dielectric coolant is a fluorinated fluid, and the pumping flow is between a heat exchanger (or chiller) and the plasma source. The coolant preferably has a low relative permittivity (dielectric constant), in the range of between 1 and 3, and a high dielectric strength (e.g. greater than 10 kV/mm). The preferable flow rate through the cooling circuit is between about 0.5 and 1.5 gallons per minute, with a most preferred rate of approximately 1 gallon/minute.

Figure 3:
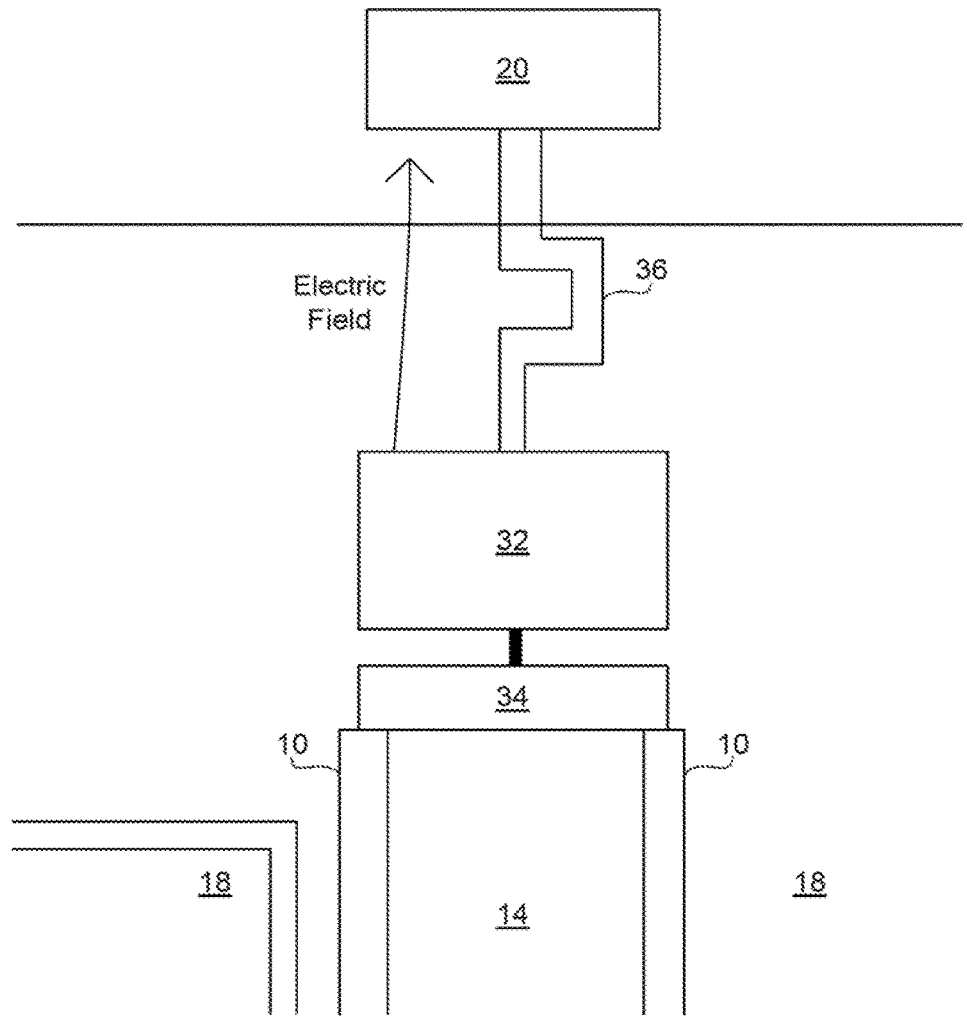
FIG. 3 is a schematic view showing a side elevation of a preferred gas inlet insulator used in the plasma ion source of FIG. 1.

FIG. 3 is a side elevation view in section of a plasma ion source constructed according to a preferred embodiment of the invention. Like elements from FIG. 1 are labeled but not discussed further here. Moving downstream from gas source 20, an insulator conducts gas from the gas source to a leak valve 32 while providing electrical insulation between the gas source and the leak valve. The leave valve 32 supplies a low pressure (e.g. approximately 10-100 mTorr) gas into the plasma chamber 10. The leak valve 32 cuts the pressure of gas in the line from about 1-100 psi supplied to the gas inlet 20 and present in the insulator 36 to about 10-100 mTorr at the flange 34 and the reactor chamber 14. As will be appreciated from a description of FIG. 3, high voltage applied to downstream flange 13 contributes to the igniting of plasma within ceramic chamber 14. This conducts potential upstream along the plasma so that ceramic chamber 14, leak valve 32 and flange 34 are electrically coupled together at the same (high voltage) potential.

An insulator 36 is interposed between the gas source connected to the gas inlet 20 and the downstream plasma source to electrically isolate elements electrically connected to the biased plasma chamber 14 to the gas source at ground potential. The insulator consists of a narrow tube or capillary that is hermetically sealed to the gas inlet on one end and the leak valve 32 at the other end. The insulator has a spiral or serpentine path such that the electric field produced between the components biased to high voltage and those at ground potential is largely perpendicular to the path of the tube with a low electric field component that is along the path of the tube. The insulator length along the spiral or serpentine path is much longer than the voltage drop length so there is a low average electric field along the insulator path. The path along the electric field is kept physically short by the narrow tube diameter so avalanche breakdown is suppressed. The gas pressure within the insulator is between about 1-100 psi and the high pressure in combination with the short avalanche breakdown path in the insulator prevents the gas from breaking down when holding off the bias voltage. Accordingly, everything on top of the insulator 36 in FIG. 3 is maintained at ground while that below the insulator is kept at the high voltage applied.

In one aspect of the invention, the plasma tube 10 is electrically isolated from ground by a combination of mechanical insulating support structures and the dielectric fluid. The insulating support structures are configured to position the plasma tube 10 containing the inner magnetic poles 54 within the assembly so that it does not touch can 24, shield 18, RF antenna 16, outer magnetic poles 52, or other elements held at a different potential. Examples of such insulated support structures include ceramic vacuum break 22 and insulator 36 (FIG. 2). An external high voltage (between 0 and 50 kV) is applied to the plasma tube and the current design uses the dielectric fluid to isolate the plasma tube at applied voltage from the Faraday shield 18, antenna 16, and other structures in the source at ground potential. This design is unique in that each of the plasma tube, the antenna, and the impedance matching network is electrically isolated and cooled by the dielectric fluid.

Another aspect of the design is that the plasma tube is substantially or completely immersed into the dielectric fluid so that the fluid can effectively transfer heat away from the plasma tube, antenna, and impedance matching network. In wafer processing configurations, the whole plasma chamber may not be immersed in fluid but typically an antenna is immersed in fluid and a dielectric window near the antenna is partially immersed in fluid. However, most of the chamber containing the plasma is not immersed in fluid.

In the present design, ions are removed from the plasma and then the ions interact with a substrate outside of the plasma. The external voltage is applied to control how energetic the ions are when they interact with the substrate. The ions are typically focused and deflected after they have been extracted from the plasma. The present design includes a means for extracting the ions and accelerating the ions to the applied voltage.

Also described is a method for operating a plasma ion source having induction coils adjacent to outer walls of a reactor chamber for inductively coupling power into the plasma from a radio frequency power source. The method comprises actively biasing the reactor chamber to a high voltage and pumping a dielectric fluid into contact with the induction coils and a substantial portion of the outer walls of the reactor chamber wherein both the reactor chamber and induction coils are electrically isolated and cooled by the dielectric fluid. The step of actively biasing the reactor chamber to a high voltage preferably includes biasing the reactor chamber to a voltage above 10 kV.

The dielectric fluid can be pumped in a circuit through a plurality of spaces in fluid communication with one another. The plurality of spaces include a space adjacent the induction coils, a space adjacent outer walls of the reactor chamber, and a space adjacent a vacuum break downstream of the reaction chamber. The method further preferably includes enclosing the induction coils with a split Faraday shield and enclosing the Faraday shield, reaction chamber, and vacuum break in a can to retain the dielectric fluid. The Faraday shield is preferably maintained at a ground potential. The circuit through which dielectric fluid is pumped includes a space between the can and the vacuum break and the can and plasma chamber.

The method can further include maintaining different elements of the plasma ion source at different voltages and providing a high voltage isolation between the antenna and Faraday shield. Furthermore, the step of pumping the dielectric fluid includes pumping the fluid through a circuit into and out of the plasma ion source at a rate of between about 0.5 and 1.5 gallons per minute and more preferably approximately 1 gallon/minute.

Figure 4:
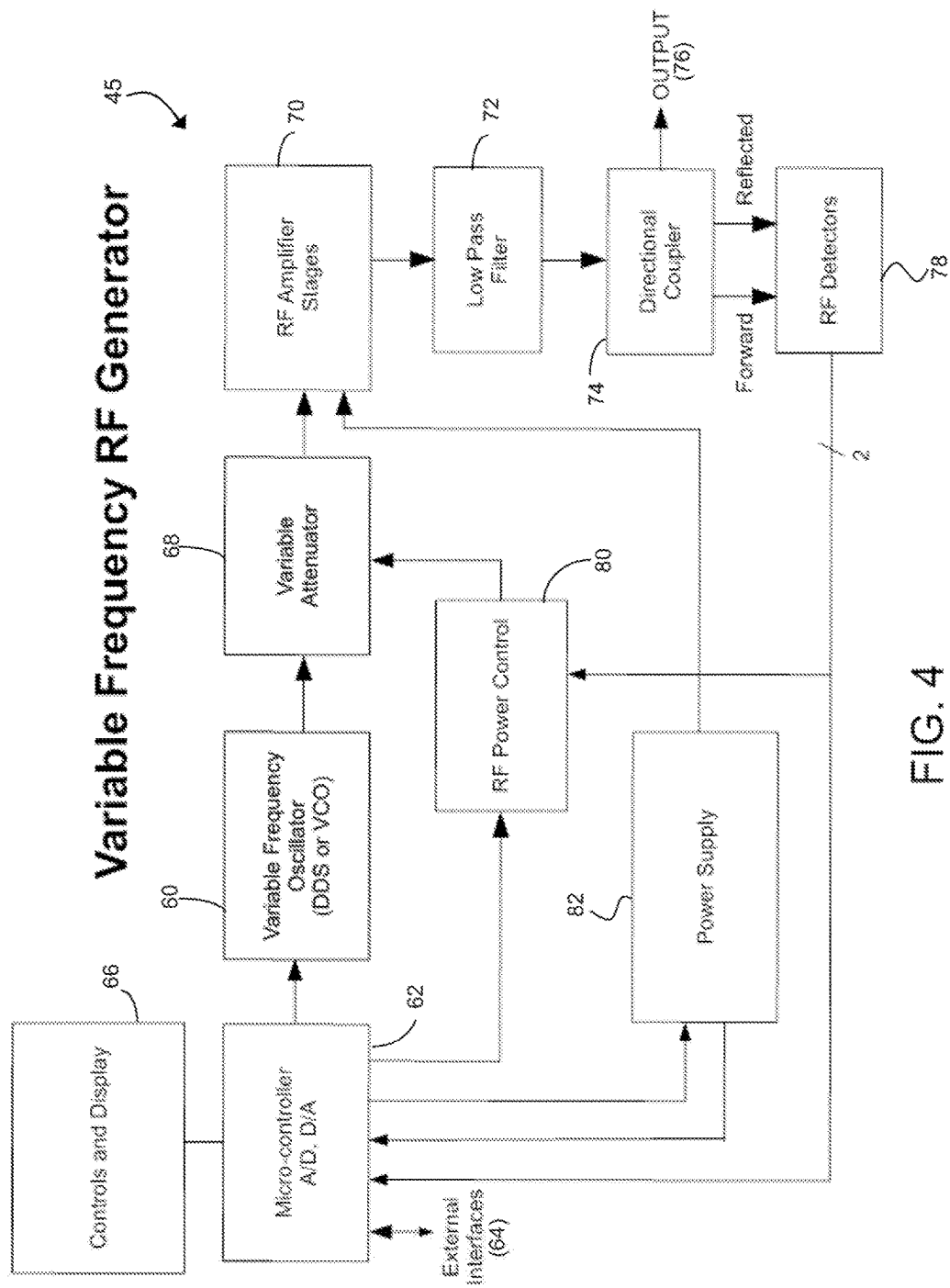
FIG. 4 is a schematic view illustrating elements of the radio frequency power source of FIG. 1.

FIG. 4 illustrates an exemplary source of radio frequency power 45 as used in association with the plasma ion source shown in FIG. 1.

Generation of the RF oscillation within the RF power source 45 begins with the variable frequency oscillator block 60, which in one embodiment is implemented using a reference crystal oscillator and direct digital synthesizer (DDS) integrated circuit. Other implementations could substitute a voltage controlled oscillator (VCO) and/or a phase lock loop (PLL) integrated circuit. Any of these take a digital frequency control number (direct command or a number to a D to A convertor) from the microcontroller 62. The user controls the frequency setting through the external interfaces 64 or through a frequency control (knob, buttons, touch panel interface, etc.) as via controls and display 66. Alternately, the frequency setting of block 60 is set by the microcontroller software, which is programmed to determine the frequency to use.

From the oscillator 60, the RF power level is adjusted by the variable attenuator 68 and raised to the output power level by succeeding amplifier stages 70 as needed. The final amplifying stage preferably uses two N channel lateral drain metal oxide semiconductor field effect transistors (LDMOS-FETs) in a single package to raise the RF power to its highest level. This provides high power gain and high output with a simple, small, and rugged amplifier stage. Higher frequency harmonics of the operating frequency are optionally reduced by a low pass filter 72 and the output signal is sent through the directional coupler 74 on the way to the output connection 76. Thereafter the signal is conducted to the matching network 49 (FIG. 1) either through a coax cable 90 (FIG. 5), or in the case of the RF generator being located on the side of the plasma source column 24 (FIG. 1), the RF power may be connected with two short individual connections (signal and return). The forward power signal from the directional coupler 74 passes through RF detector 78 and provides feedback to the RF power control circuit 80 though line 2, which adjusts the variable attenuator 68 in order to maintain the power level commanded by the microcontroller 62.

The reflected power signal from the directional coupler 74 passed through RF detector provides feedback to the user—e.g. on a display 66 or remotely through the external interfaces 64—as to how well matched the system is at the present operating frequency. Optionally, an automatic tuning algorithm running on the microcontroller 62 does the same. Using this number, the user or algorithm can adjust the frequency to the optimum, minimum reflected power point.

The circuit is completed by coupling microcontroller 62 and RF amplifier stages 70 to power source 82.

Figure 5:
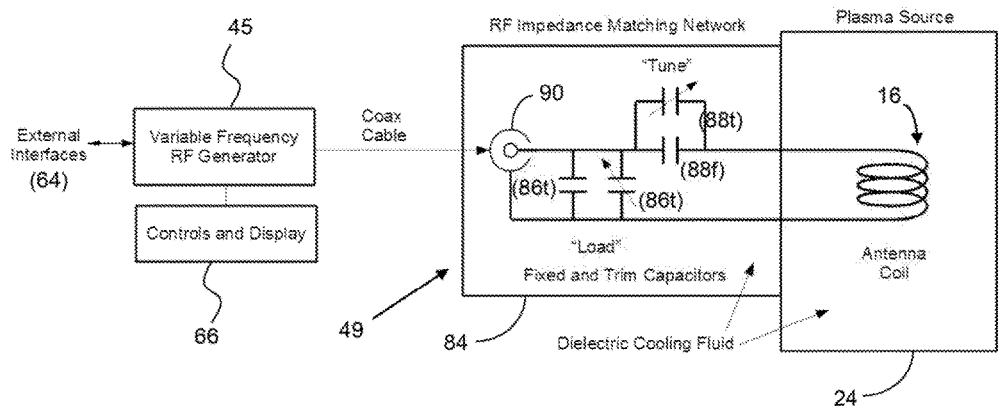
FIG. 5 is a schematic view illustrating elements of the impedance matching network of FIG. 1 according to one embodiment of the invention.

FIG. 5 illustrates a first embodiment of an impedance matching network 49 used in association with the plasma ion source shown in FIG. 1. This impedance matching network 49 is incorporated into a lateral projection of a generally cylindrical source enclosure or can 24 (FIG. 1) into which the antenna coil 16 is placed. The load and tune capacitors of the impedance matching network 49 each include a main fixed capacitor 86f, 88f, respectively, coupled in parallel with a respective trim capacitor 86t, 88t. In the case that the capacitance of the "fixed" capacitors 86f, 88f are not exactly fixed on the value advertised, e.g. that a labelled "100 μf capacitor" is actually 99.6 μf, the supplemental trim capacitors can be incorporated to bring the circuit up to the specified 100 μf. In this way, the network 49 can impart capacitance with high precision since the trim capacitors 86t, 88t can be adjusted to bring the fixed capacitors 86f, 88f to their needed values. Impedance matching network 49 is then coupled to the variable frequency RF generator 45 via a coax cable connection 90. A dielectric fluid is then flowed through a circuit in adjacent to or in contact with the plasma source 24 and the impedance matching network 84 to effect cooling of the apparatus during high energy operation.

Figure 6:
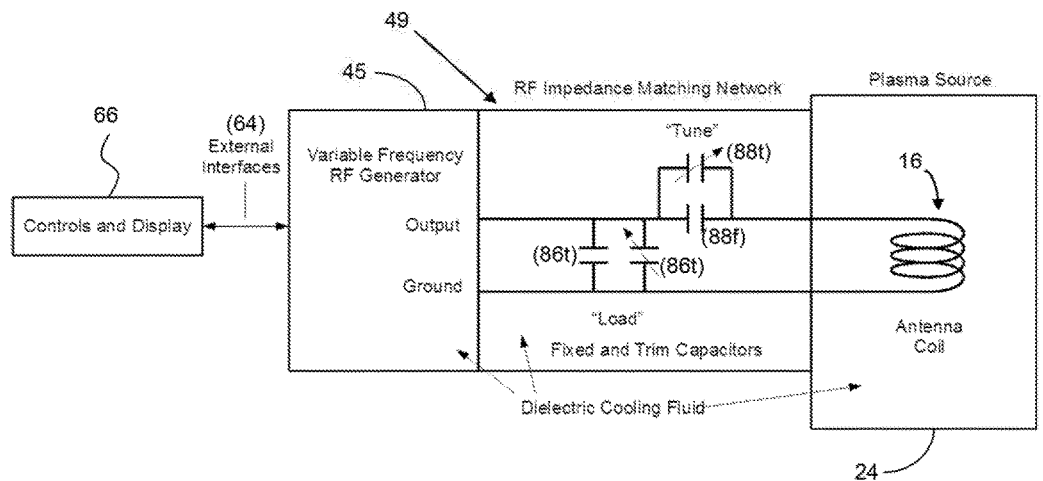
FIG. 6 is a schematic view illustrating elements of the impedance matching network of FIG. 1 according to an alternative embodiment of the invention.

FIG. 6 illustrates a second embodiment of an impedance matching network 49 used in association with the plasma ion source shown in FIG. 1. This embodiment is much like that shown in FIG. 5, but has much of the RF power source 45 located against the source enclosure and sharing contact with the cooling fluid.

The 'output' shown in FIG. 6 is the same connection as is satisfied by the coax cable and the RF connector 90 in FIG. 5, and the 'ground' connection in FIG. 6 is the same as item 24 in FIG. 1. In the embodiment shown in FIG. 1, the RF signal is fed into the matchbox (49) via the central wire of the coax cable. The outer shield of the coax cable (which is connected to item 24) carries the return current to the RF generator. Item 24 is at ground potential and is connected to the outer shield of the coax cable.

In the embodiment shown in FIG. 6, there's no need for a coax cable or the coax cable connector (90), and instead the RF generator is directly attached to the match circuit, where the 'output' connects directly to the same point in the match circuit that the RF signal is connected to in FIG. 1. For FIG. 6, the return current still travels through item 24, back to the ground connection of the RF generator, but it no longer needs to travel through the outer shield of a coax cable.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A plasma source for processing or imaging a substrate, secondary ion mass spectrometry, ion source for proton therapy, and high energy particle accelerators comprising:
    a reactor chamber within which a plasma is generated to produce at least one plasma product for processing or imaging the substrate, secondary ion mass spectrometry, ion source for proton therapy, ion thrusters, and high energy particle accelerators, the reactor chamber including outer walls that are actively biased to a high voltage;

a gas source coupled to the reactor chamber to provide gas into the reaction chamber;

an exit aperture coupled to the reactor chamber to allow extraction of ions from the reactor chamber;

a first source of radio frequency power with tunable radio frequency;

a plurality of induction coils adjacent to the reactor chamber and coupled to said first source of radio frequency power to inductively couple power into the plasma from said first source of radio frequency power through an impedance matching network comprised of fixed capacitors that are not variable, wherein the frequency of the power is adjusted to allow efficient power coupling between the source of radio frequency power and the plasma source.

2. The plasma source of claim 1, further including one or more trim capacitors in the impedance matching network.

3. The plasma source of claim 2, the one or more trim capacitors arranged in parallel with a respective one of the fixed capacitors.

4. The plasma source of claim 1, wherein the impedance matching network is in contact with a dielectric fluid to thermally cool and electrically isolate the impedance matching network.

5. The plasma source of claim 1, wherein the source of radio frequency power is in contact with a dielectric fluid to thermally cool and electrically isolate the source of radio frequency power.

6. The plasma source of claim 5, wherein laterally diffused metal oxide semiconductor field effect transistors are used to produce power in the radio frequency power source.

7. The plasma source of claim 1, wherein lateral drain metal oxide semiconductor field effect transistors (LDMOSFETs) are used to produce power in the radio frequency power source.

8. The plasma source of claim 7, wherein a final stage of the first source of radio frequency power includes two or more LDMOSFETs in a single package to raise the RF power to its highest level.

9. The plasma source of claim 1, wherein the power source includes a variable frequency oscillator block uses a reference crystal oscillator and direct digital synthesizer (DDS) integrated circuit.

10. The plasma source of claim 1, wherein the power source includes a variable frequency oscillator block uses a voltage controlled oscillator (VCO).

11. The plasma source of claim 10, wherein the power source includes a variable frequency oscillator block uses a phase lock loop (PLL) integrated circuit.

12. The plasma source of claim 1, wherein the power source includes a variable frequency oscillator block uses a phase lock loop (PLL) integrated circuit.

\* \* \* \* \*